(12) United States Patent
Torek et al.

(10) Patent No.: US 8,084,845 B2
(45) Date of Patent: Dec. 27, 2011

(54) SUBRESOLUTION SILICON FEATURES AND METHODS FOR FORMING THE SAME

(75) Inventors: Kevin J. Torek, Meridian, ID (US); Mark Fischer, Boise, ID (US); Robert J. Hanson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/713,125

(22) Filed: Feb. 25, 2010

(65) Prior Publication Data

US 2010/0148234 A1 Jun. 17, 2010

Related U.S. Application Data

(62) Division of application No. 11/486,800, filed on Jul. 14, 2006, now Pat. No. 7,678,648.

(51) Int. Cl.
*H01L 29/06* (2006.01)
(52) U.S. Cl. ......... 257/618; 257/623; 257/624; 257/626
(58) Field of Classification Search .................. 257/296, 257/288, 586, 618, 623–626, 494–496, 600, 257/599, 622, 506, 354, 327, 337, 338, 343, 257/351
See application file for complete search history.

(56) References Cited

U.S. PATENT DOCUMENTS

| | | | |
|---|---|---|---|
| 6,057,580 A | 5/2000 | Watanabe et al. | |
| 6,222,225 B1 | 4/2001 | Nakamura et al. | |
| 6,417,047 B1 * | 7/2002 | Isobe | 438/258 |
| 6,720,610 B2 | 4/2004 | Iguchi et al. | |
| 6,767,813 B2 * | 7/2004 | Lee et al. | 438/585 |
| 6,911,697 B1 | 6/2005 | Wang et al. | |
| 6,974,746 B2 | 12/2005 | Iguchi et al. | |
| 7,041,558 B2 | 5/2006 | You et al. | |
| 7,074,623 B2 | 7/2006 | Lochtefeld et al. | |
| 7,183,615 B2 | 2/2007 | Yamashita et al. | |
| 7,382,015 B2 | 6/2008 | Iguchi et al. | |
| 7,396,720 B2 | 7/2008 | Sandhu et al. | |
| 7,488,646 B2 | 2/2009 | Iguchi et al. | |
| 7,524,747 B2 | 4/2009 | You et al. | |
| 7,582,928 B2 | 9/2009 | Iguchi et al. | |
| 2002/0011612 A1 * | 1/2002 | Hieda | 257/262 |
| 2002/0140039 A1 | 10/2002 | Adkisson et al. | |
| 2003/0129845 A1 | 7/2003 | Cabuz et al. | |

(Continued)

FOREIGN PATENT DOCUMENTS

CN 1655365 A 8/2005

OTHER PUBLICATIONS

Ruge, I. and Mader, H., "Halbleiter-Technologie" Springer Verlag, Berlin, pp. 212-215 (1991).

(Continued)

*Primary Examiner* — Chuong A. Luu
(74) *Attorney, Agent, or Firm* — Knobbe, Martens, Olson & Bear, LLP

(57) ABSTRACT

Novel etch techniques are provided for shaping silicon features below the photolithographic resolution limits. FinFET devices are defined by recessing oxide and exposing a silicon protrusion to an isotropic etch, at least in the channel region. In one implementation, the protrusion is contoured by a dry isotropic etch having excellent selectivity, using a downstream microwave plasma etch.

20 Claims, 7 Drawing Sheets

U.S. PATENT DOCUMENTS

| | | |
|---|---|---|
| 2004/0150037 A1 | 8/2004 | Katsumata et al. |
| 2004/0262687 A1* | 12/2004 | Jung et al. .................... 257/347 |
| 2005/0104091 A1 | 5/2005 | Tabery et al. |
| 2005/0136617 A1 | 6/2005 | Jang |
| 2005/0167754 A1 | 8/2005 | Kang et al. |
| 2005/0173768 A1 | 8/2005 | Lee et al. |
| 2005/0255643 A1 | 11/2005 | Ahn et al. |
| 2005/0285509 A1* | 12/2005 | Funamoto et al. ............ 313/504 |
| 2006/0105578 A1 | 5/2006 | Hong et al. |
| 2007/0287259 A1 | 12/2007 | Kavalieros et al. |

OTHER PUBLICATIONS

Chinese Office Action issued Nov. 27, 2009 in corresponding Patent Application No. 200780025866.6.

International Search Report issued Nov. 5, 2007 in corresponding PCT Application No. PCT/US2007/015146.

* cited by examiner

SUBRESOLUTION SILICON FEATURES AND METHODS FOR FORMING THE SAME

RELATED APPLICATION INFORMATION

This application is a divisional of U.S. patent application Ser. No. 11/486,800, filed on Jul. 14, 2006 now U.S. Pat. No. 7,678,648, which is hereby incorporated by reference in its entirety.

BACKGROUND OF THE INVENTION

1. Field of the Invention

The present invention relates to methods of isotropically etching silicon and devices formed thereby, particularly in the context of dense integration schemes employing FinFET devices.

2. Description of the Related Art

Semiconductor devices, such as RAM memory, are commonly used devices in computer applications. Typically, there is a strong desire to increase the density of these types of devices so as to improve device performance and reduce cost. For DRAM memory, there are two basic components, a charge storage cell and a gate for accessing the charge storage cell. As the need for increased density arises, there is a need for developing types of gates which are smaller in size to facilitate higher density of devices.

One type of gate device that is currently being used in a variety of applications, including memory applications, is a FinFET device. In general, a FinFET device is formed on a semiconductor substrate, such as a silicon substrate, on a silicon-on-insulator (SOI) substrate or other types of material. Typically, a fin is formed which is a vertically extending protrusion typically made of a semiconductor material, such as silicon. The fin has two vertical sidewalls over which a gate dielectric and a conductor can be positioned such that, when the conductor is charged, the resulting electric field creates channel regions in the fin that are controllable by the electric field on both sides of the fin. As a result of being able to control the channel regions from at least two sides of the fin, a conductive channel can be formed in the fin, which is smaller, thereby facilitating reduced device dimension with reduced leakage.

While FinFET devices provide advantages over traditional planar MOSFET devices, there is still a need to optimize the performance of FinFETs. In particular, reducing the threshold voltage to form the channel region and improving the scalability of the devices are important design considerations. Moreover, improving the refresh rate and improving the reliability of existing FinFET devices are also viewed as important objectives for obtaining even smaller FinFET devices to thereby allow for even greater device densities on semiconductor circuits such as DRAM devices and the like.

One way in which FinFET devices can be more effectively scaled is to improve the precision of processing steps used to create the devices. The inventors have recognized, for example, that greater control in silicon etching processes opens the door to greater flexibility in reliable device design and integration schemes for FinFET devices. Similarly, it will be appreciated that improved control in silicon etching would be beneficial for a variety of integrated circuit (IC) structures and processes, particularly where such etching defines lateral dimensions of IC features.

BRIEF DESCRIPTION OF THE DRAWINGS

The figures and detailed description below are meant to illustrate and not to limit the invention. The figures employ like reference numbers for similar parts, even if not identical, and are schematic only and not drawn to scale.

DETAILED DESCRIPTION OF THE PREFERRED EMBODIMENTS

The embodiments described herein provide improved control for silicon etching, and more particularly isotropic, selective etching of silicon relative to surrounding insulating materials such as silicon oxide based materials. Improved control over silicon etching facilitates formation of novel semiconductor devices exemplified, in the illustrated embodiments, by FinFET devices in a dense integration scheme, particularly in the context of DRAM arrays. The isotropic nature of the dry etches described herein facilitates lateral etching to define lateral dimensions below the lithographic limit.

In the processes described below, semiconductor mesas are defined and surrounded by isolation material. The isolation material is then recessed such that upper portions of the active area mesas protrude above the upper surface of the isolation material. The semiconductor protrusions are then isotropically dry etched to define a contoured fin portion of the semiconductor protrusion so that the contoured portion has a reduced width. Subsequently, a gate dielectric and conductor are conformally formed over the contoured portion of the semiconductor protrusion. In one embodiment, the fin formed by such contouring extends across a majority of the active area mesa; in another embodiment, the fin is confined to a gate or channel region of the transistors being formed.

By isotropically dry etching the upper portion of the mesa that is to receive the conductor, the resulting contour or fin has a greater surface area over its undulations and thus effectively increased transistor channel length. Additionally, the upper end of the fin is tapered or rounded. This creates a FinFET device with better performance characteristics, for example FinFETs with reduced threshold voltage requirements and better refresh and reliability characteristics. In one particular implementation, the dry isotropic etch is a remote plasma etch, which allows for more uniform etching of the exposed portion of the protrusion. Moreover, as disclosed in more detail below, high selectivity relative to surrounding materials can be obtained by selected conditions.

Hence, this process allows for the formation of semiconductor devices with improved design characteristics. The aforementioned advantages will become more fully apparent from the following description taken in conjunction with the accompanying drawings.

Figure 1A:
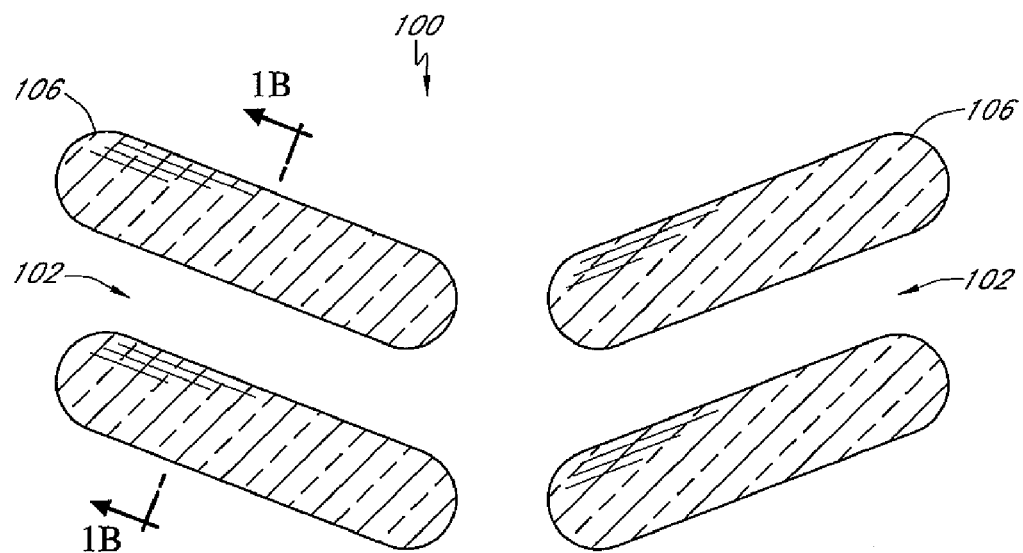
FIG. 1A is a simplified schematic plan view of a plurality of active area mesas surrounded by field isolation material on a semiconductor substrate.

Reference will now be made to the drawings wherein like numerals refer to like parts throughout. FIG. 1A illustrates a semiconductor substrate 100 where a plurality of active area mesas 106 have been formed among field isolation regions 102 using well-known masking processes. Although FIGS. 1A, 5, 6A and 10 are top down plan views, hatching is employed to clarify the different materials. The active area mesas 106 are spaced apart from each other by the field isolation regions 102. As will be described in the following process flow, the upper portions of the active area mesas 106 are first made to protrude and then selectively thinned by dry isotropic etching to enhance the performance characteristics of the resulting devices.

Figure 1B:
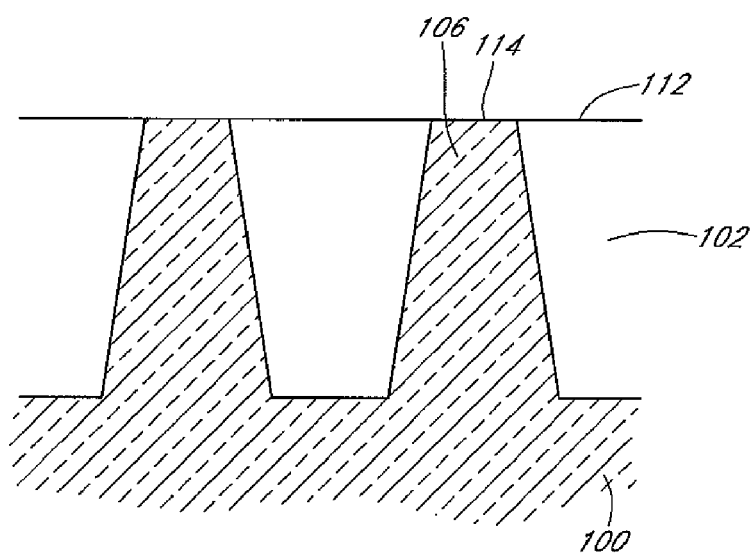
FIG. 1B is a schematic cross-sectional view of the active areas of FIG. 1A taken along the lines of 1B-1B in FIG. 1A.

As is illustrated in FIG. 1B, the field isolation regions 102 are preferably formed in a well-known manner. Typically the field isolation 102 is a form of silicon oxide, such as $SiO_2$, TEOS, BPSG, F- or C-doped silicon oxide and a variety of similar materials formed by chemical vapor deposition or spin on deposition. In one particular shallow trench isolation (STI) implementation, trenches are formed in the semiconductor substrate 100 by masking the active area mesas 106 using photolithography, and etching through the mask. Silicon oxide is deposited (preferably by spin-on deposition) so as to cover the substrate 100, fill the trenches and cover upper surfaces 114 of the mesas 106. Subsequently, chemical mechanical planarization (CMP) or other etching processes can be used to planarize and expose the upper surfaces 114 of the mesas 106 such that an upper surface 112 of the field isolation 102 is coplanar with the mesas 106. In other arrangements, field isolation material could be grown by oxidation (LOCOS) or formed by hybrid LOCOS and STI processes. In either case, lithography defines the dimensions of the active area mesas 106, and in the illustrated embodiment the lithography employed to define the active area mesas 106 has a photolithographic resolution limit between about 50 nm and 150 nm, more preferably about 60 nm and 80 nm. It will be understood that the resolution of such systems can scale with lithography improvements.

While not illustrated in the preferred embodiment, the mask (whether resist or hard mask) used for patterning the active areas and etching the field isolation trenches can optionally remain in place to protect the upper surface 114 of the active area mesas 106 during the subsequent oxide recess step, described below with respect to FIG. 2.

Figure 2:
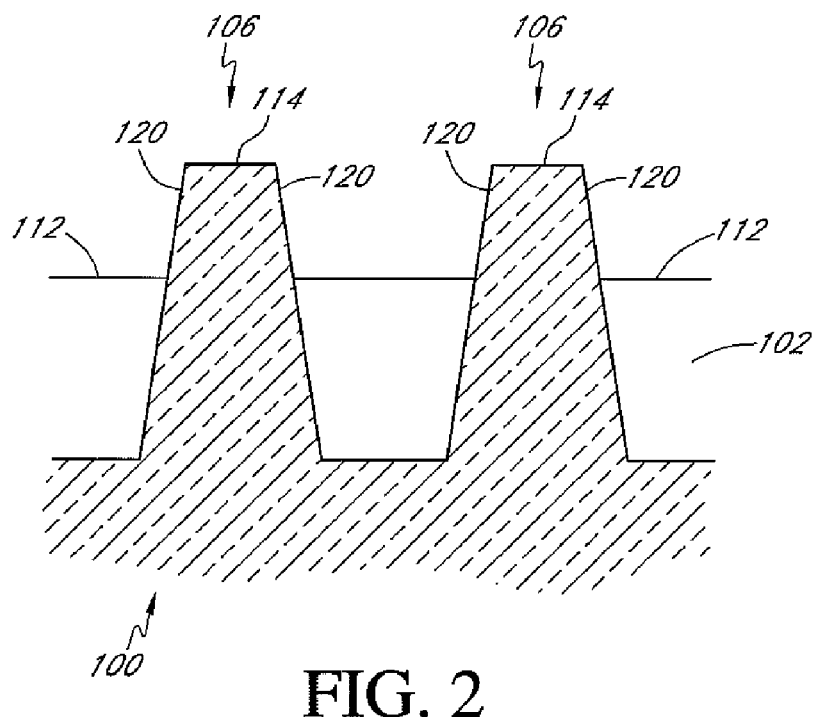
FIG. 2 is a cross-sectional view of the active area mesas of FIG. 1B wherein the isolation material surrounding the mesas has been recessed.

As is shown in FIG. 2, the material of the field isolation regions 102 is then recessed relative to the mesas 106 so as to expose lateral sides or sidewalls 120 of the active area mesas 106. In one particular implementation, the field isolation material is recessed using a wet or dry etching process that selectively removes silicon oxide without substantially etching silicon. In one implementation, the isolation material is recessed by between about 500 Å and 1300 Å, e.g., approximately 900 Å, thus leaving a silicon protrusion with a height of about 900 Å over the now-recessed upper surface 112 of the field isolation regions 102.

Figure 3:
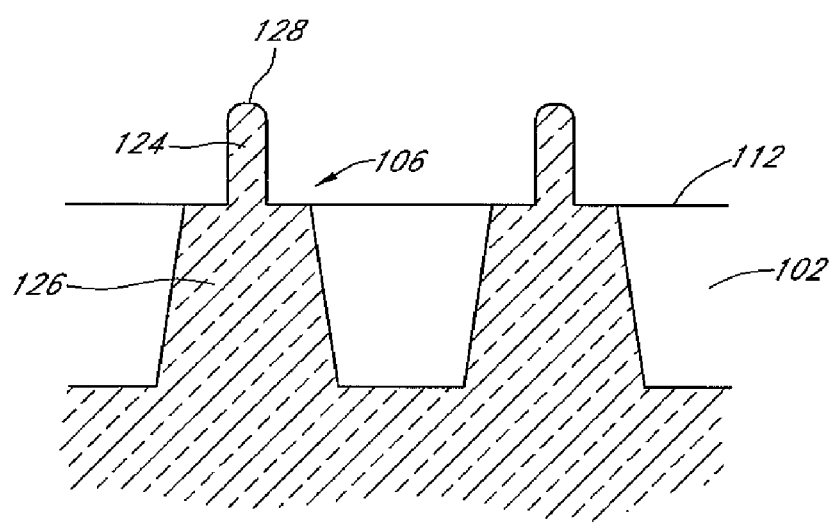
FIG. 3 is a cross-sectional view of the active area mesas of FIG. 2 following a dry isotropic etch to contour fins.

As is illustrated in FIG. 3, the protruding portion of the active area mesas 106 are subsequently contoured using an isotropic etching process to produce fins 124 of the active area mesas 106 that are tapered with respect to a lower region 126 (which remains protected by field isolation regions 102). The upper surface 128 of each fin 124 is rounded by the isotropic etch. Preferably, the smallest lateral dimension or width of the fin 124 is less than 300 Å, more preferably between about 200 Å and 250 Å.

Due to the small dimensions at issue, and the precision called for by the highly scaled scheme for the DRAM array of the preferred embodiments, Applicants have found that dry isotropic etching affords a high degree of control and precision for the shaping the fin, particularly because the features being defined have dimensions below the photolithographic resolution limit. Accordingly, the isotropic etch is preferably a dry etch, more preferably employing products of a remote plasma, such as in a downstream microwave plasma reactor. It has also been found that a high degree of selectivity for silicon can be achieved using such a reactor with appropriate chemistries. In two of the three process recipes below, the chemistry includes a source of oxygen and a source of fluorine. An exemplary oxygen source is oxygen gas ($O_2$), and a fluorocarbon gas source (e.g., $CF_4$) or $NF_3$ can be used as the source of fluorine. Alternatively, oxygen can be omitted.

An exemplary "low selectivity" process is performed flowing oxygen gas ($O_2$) and $CF_4$ gas through a remote plasma unit. A relatively high ratio (greater than 15:1) of $O_2$ to $CF_4$ is used in this low selectivity process, and in an exemplary embodiment, a ratio of about 24:1 results in a selectivity of silicon:oxide etching ratio of about 5:1. Good uniformity and a smooth crystal silicon surface is left by this low selectivity process. This dry isotropic etch process has been found to afford great precision in both the etch rate and the ability to control the stopping point. Such control is important when the isotropic etching accomplishes lateral dimension changes to a feature. Such lateral dimensions should be precisely controlled in order to ensure the uniformity from device-to-device across an array, from array-to-array across a chip, from chip-to-chip across a wafer, and from wafer-to-wafer among a batch. Because the fin 124 is a functional feature of a field effect transistor, variances in thickness that result from variances in the isotropic etching process could result in inconsistent device performance and lower yields. Table 1 below provides preferred parameter ranges for an exemplary low selectivity process recipe.

TABLE 1

Low Selectivity Process

|  | Temp. (° C.) | Pressure (mTorr) | Microwave Power (Watts) | $O_2$ Flow (sccm) | $CF_4$ Flow (sccm) | Gas Ratio ($O_2$:$CF_4$) | Total Gas Flow (sccm) | Approx. Selectivity (Si:$SiO_2$) |
|---|---|---|---|---|---|---|---|---|
| Preferred | 60-90 | 300-1500 | 500-6000 | 800-1100 | 30-50 | 20-30 | 830-1150 | 3-5.5 |
| More Preferred | 80-90 | 800-1100 | 1500-2500 | 900-1000 | 35-45 | 22-25 | 935-1035 | 3-5.5 |

Alternatively, lower temperatures, lower ratios of oxygen source gas to fluorine source gas, and optionally lower pressures can provide a "high selectivity" relative to surrounding insulating materials such as silicon oxide. For example, Table 2 below provides an exemplary high selectivity process recipe using oxygen:fluorine source gas volumetric flow ratios of less than about 5:1 and other parameter preferences that can result in selectivities between 10:1 and 25:1.

TABLE 2

High Selectivity Process

|  | Temp. (° C.) | Pressure (mTorr) | Microwave Power (Watts) | $O_2$ Flow (sccm) | $CF_4$ Flow (sccm) | Gas Ratio ($O_2$:$CF_4$) | Total Gas Flow (sccm) | Approx. Selectivity (Si:$SiO_2$) |
|---|---|---|---|---|---|---|---|---|
| Preferred | 20-90 | 300-1500 | 250-6000 | 150-750 | 150-450 | 1-5 | 300-1200 | 10-25 |
| More Preferred | 20-60 | 500-800 | 250-800 | 200-700 | 200-400 | 1-3 | 400-1100 | 18-25 |

As illustrated by the process of Table 3 below, oxygen can optionally be omitted from the process while still obtaining high selectivity. For example, the process recipe below provides inert gas in the form of helium and forming gas ($N_2$/$H_2$) along with a source of fluorine. As illustrated by the exemplary process recipes and preferred ranges below, etch selectivities (silicon:oxide) of 15:1 to 25:1 can be obtained.

TABLE 3

High Selectivity Process Without Oxygen

|  | Temp. (° C.) | Pressure (mTorr) | Microwave Power (Watts) | He Flow (sccm) | $N_2$/$H_2$ Flow (sccm) | $CF_4$ Flow (sccm) | Total Gas Flow (sccm) | Approx. Selectivity (Si:$SiO_2$) |
|---|---|---|---|---|---|---|---|---|
| Preferred | 60-90 | 300-1500 | 500-6000 | 500-2500 | 0-420 | 20-120 | 500-3500 | 15-25 |
| More Preferred | 80-90 | 800-1100 | 1500-2500 | 1300-1800 | 20-370 | 40-80 | 1350-1900 | 18-25 |

Furthermore, the skilled artisan will readily appreciate that the fluorine source in the isotropic dry etch can be other than $CF_4$. For example, $NF_3$ can replace $CF_4$ in the above-noted dry isotropic etch recipes, where for a given recipe the $NF_3$ flow rates are set to approximately one-half the flow rates given for $CF_4$. This is because $NF_3$ more readily dissociates into free fluorine in the remote plasma chamber. Similarly, the skilled artisan will readily appreciate that other adjustments can be made to the aforementioned recipes, for example, pressure and power conditions can be readily adjusted to adjust the selectivity of the process with concomitant changes in overall etch rates.

Figure 4:
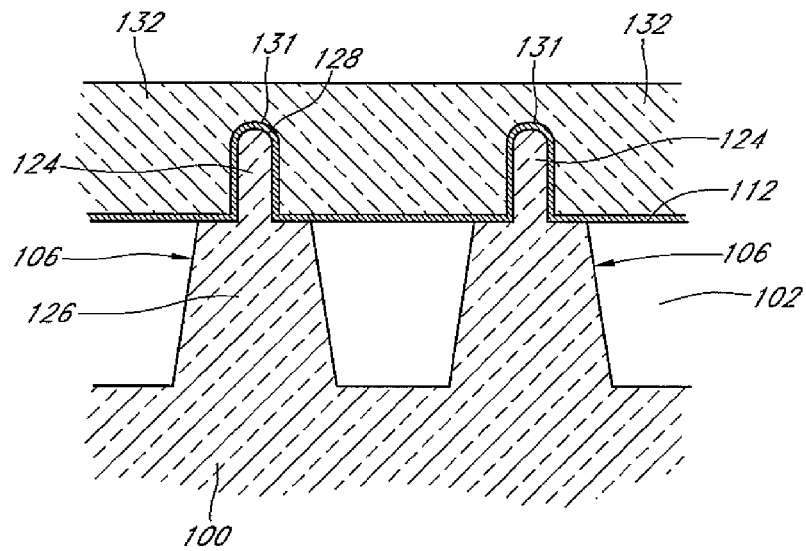
FIG. 4 is a cross-sectional view of the active area mesas of FIG. 3 wherein a gate dielectric and a gate conductor have been formed over the fins.

Subsequently, as shown in FIG. 4, a gate dielectric 131 and gate conductor 132 can be formed over the active area mesas 106, including the tapered fin portions 124. The gate conductor 132 is preferably formed of polysilicon metal, metal silicide or any other suitable gate material to set the transistor work function. While illustrated as a single layer, typically a gate stack includes the work function setting electrode material, an optional metallic strapping layer for better lateral conductivity, and a dielectric capping layer. When voltage is applied to the conductor 132, regions of the active areas 106 that are positioned underneath the gate conductor 132 form conductive channels. Due to excellent control over the preferred dry, isotropic etch, the fins 124 increase the surface area of the channels, having both rounded upper surfaces 128 as well as substantially vertical sidewalls, demonstrating excellent fidelity to the original sidewalls 120 (FIG. 2) of the silicon protrusion defined by recessing oxide.

Figure 5:
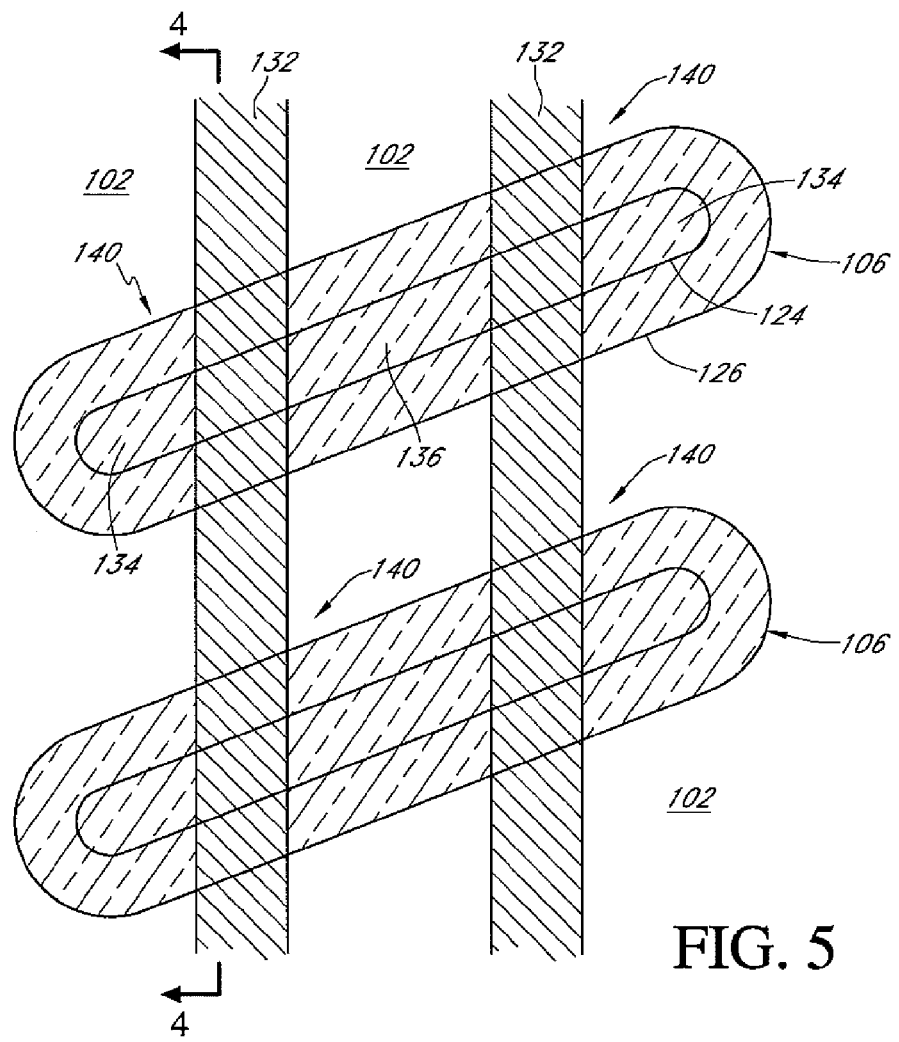
FIG. 5 is a simplified top view of part of an exemplary array of FinFET devices formed according to the process illustrated in FIGS. 1-4.

FIG. 5 is a plan view illustrating several transistor devices 140 formed using the process described in connection with FIGS. 1-4. As illustrated, the active area mesas 106 are tapered in the above-described manner across central regions of each mesa 106 to form the fins 124 extending above recessed lower portions 126. The gate conductor 132 is formed by blanket deposition, lithographic patterning and etching of a stack of gate materials (e.g., polysilicon or silicide, metallic strap for improved lateral conductivity and a dielectric cap). The photolithographic limit of the system used to define the gate lines 132 is preferably between about 50 nm and 150 nm, although future systems may have even finer resolution. The resultant gate lines 132 cross the mesas 106 to define underlying channel regions within the mesas 106, including the portion of the fins 124 underneath the gate 132. Source regions 136 and drain regions 134 are defined on opposite sides of the conductor 132 and the source/drain regions 134, 136 can be connected to other components, such as for example, bit lines, storage nodes, e.g., capacitors, and the like, as explained in more detail below with respect to the embodiment of FIG. 11. While FIG. 5 illustrates only two active area mesas 106, defining four FinFET devices 140, a person of ordinary skill in the art will appreciate that FIG. 5 is simply exemplary and that an array of thousands of transistors 140 on active area mesas 106 can be formed simultaneously using the process described above.

In the process described above in connection with FIGS. 1-5, the active area mesas 106 are globally tapered to thereby improve the performance characteristics of the resulting FinFET devices. By tapering or contouring the semiconductor mesas 106 to form the fins 124, the channel length of the transistor is lengthened without occupying more real estate, and the corners of the fin 124 are also rounded, such that it reduces the threshold voltage requirements to form the inversion or channel regions, improves access device scaling and results in better refresh and reliability characteristics of the device. In this particular embodiment, the method results in the mesa 106 being tapered along its entire length. Unfortunately, the step, between the fin 124 and the lower portion 126 of the active area mesas 106 can create problems for subsequent pattern and etch steps. In particular, with reference to FIG. 5, the gate material is blanket deposited and etched away from the source regions 136 and drain regions 134 of the active areas 106. Removal of the gate materials from over a vertical side wall, however, is challenging and can lead to overetching and damage to the active areas in the source regions 136 and drain regions 134. Those same regions need to be etched again when contacts are subsequently opened up to those source/drain regions 134, 136.

FIGS. 6-11 illustrate a process whereby the active area mesa 106 is only tapered in the gate or channel region that is to receive the gate conductor 132. Referring initially to FIG. 6A, a masking layer 146, such as transparent carbon or photoresist, is globally deposited over the substrate 100. The masking layer 146 is deposited onto the substrate 100 after etching trenches, filling with field isolation material 102 and planarizing down to the top surface 114 of the mesas 106, as shown in FIG. 6B. Referring back to FIG. 6A, the masking layer 146 is then patterned and etched to define openings 148 in the masking layer 146. The openings 148 follow the pattern of the gate conductors 132 (see, e.g., FIG. 10 below), and the mask 146 thus follows an inverse pattern. Thus, the same reticle can be used for both these masks, but with opposite photoresist types (negative versus positive).

A spare line opening 149 is formed between columns of active areas 106. This spare opening 149 forms due to the use of the same mask that will be used for patterning the gate lines or word lines. It has been found that evenly spaced lines are easier to photolithographically define, particularly close to the photolithographic limit. Accordingly, nonfunctional lines will be formed at the same location that the mask opening 149 is formed. Whereas the dummy line opening 149 exposes only underlying field isolation material 102, the gate line openings 148 expose both underlying oxide material 102 and exposed regions of active area mesas 106. Because the gate line openings 148 are formed in the same pattern as the future gate electrodes, only the gate or channel regions of the active area mesas 106 are exposed by this mask 146.

Figure 6A:
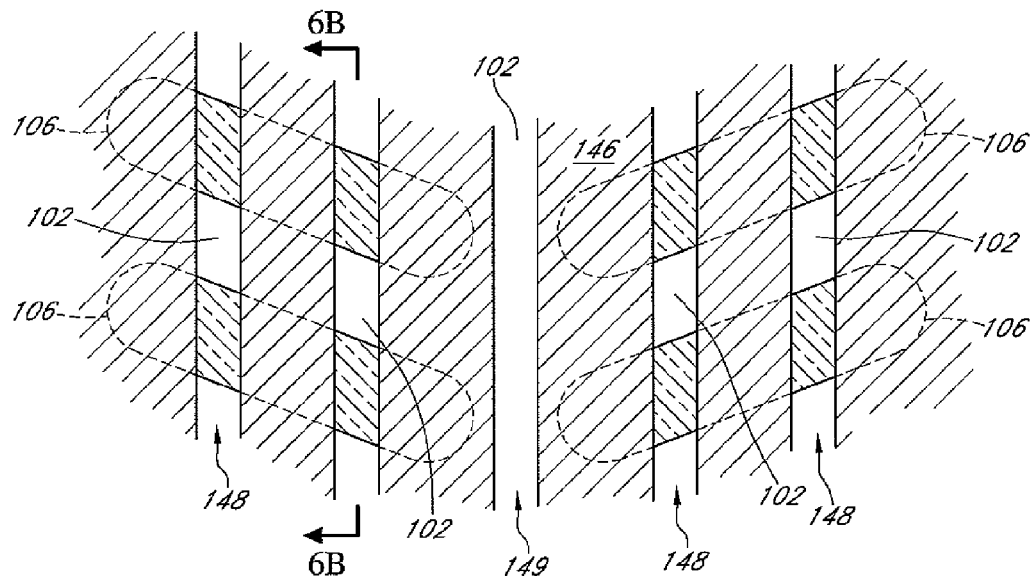
FIG. 6A is a schematic plan view of a plurality of active area mesas formed on a substrate wherein a mask is patterned to expose channel or gate regions of the mesas only for damascene-type processing.
Figure 6B:
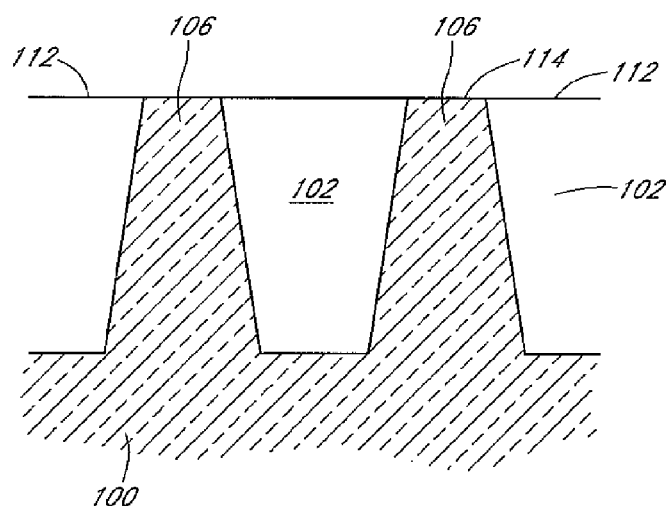
FIG. 6B is a cross-sectional view of the active areas of FIG. 6A taken along the lines 6B-6B.
Figure 7:
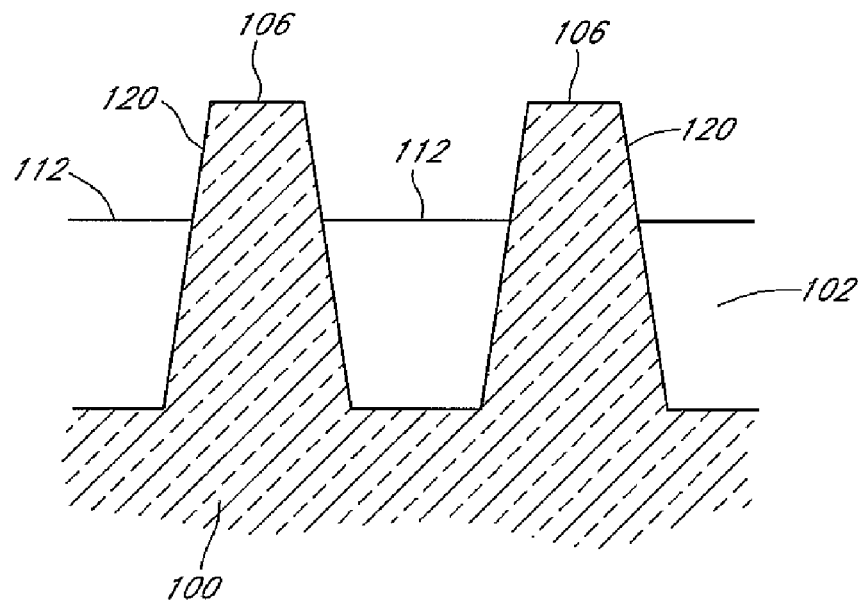
FIG. 7 is a cross-sectional view of the active area mesas of FIG. 6B wherein the isolation material has been recessed within the exposed gate line regions only.

As is illustrated in FIG. 7, the field isolation regions 102 are then thinned or recessed using a selective oxide etch so as to expose the sidewalls 120 of the active area mesas 106 and form silicon protrusions. Preferably, the protrusion extends about 500 Å to 1300 Å, e.g., about 900 Å, above the surface 112 of the recessed field isolation regions 102. As noted, the recesses (and hence the protrusions) are formed only in the regions 148, 149 exposed through the mask layer 146 (FIG. 6A).

Figure 8:
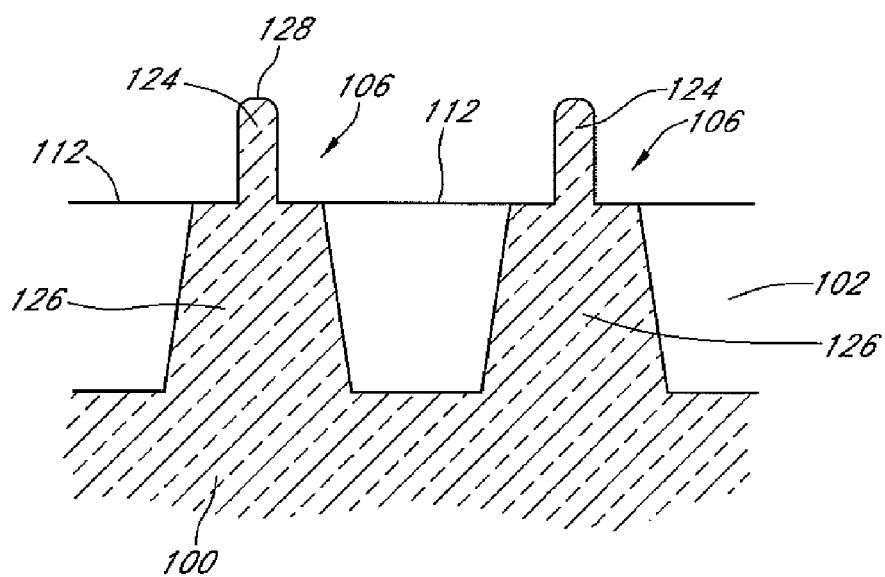
FIG. 8 is a cross-sectional view of the active area mesas of FIG. 7 following a selective etch to contour fins within channel or gate regions only.

Subsequently, as shown in FIG. 8, the protruding portions of the active area mesas 106 are isotropically etched through the mask 146 (see FIG. 6A) using, for example, one of the dry, isotropic selective etch processes described above with respect to Tables 1-3. The mesas 106 are each left with an upper region or fin 124 that tapers to a rounded end 128 and a lower region 126 surrounded by field isolation material 102. As noted above, the width or smallest lateral dimension of the fin 124 is preferably less than 300 Å, more preferably between about 200 Å and 250 Å. Due to the isotropic nature of the dry etch, the mask layer 146 (FIG. 6A) may be slightly undercut and the recessed silicon 126 on either side of the fin may be slightly wider than the gate lines 148, widening with distance from the fins 124.

Figure 9:
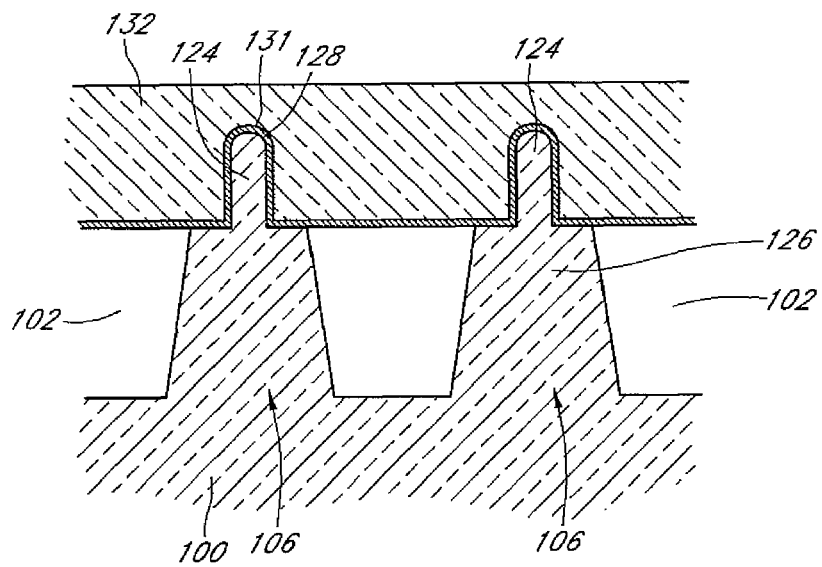
FIG. 9 is a cross-sectional view of the fins of FIG. 8, wherein a gate dielectric and gate conductor have been formed over the fins.

Subsequently, as shown in FIG. 9, the gate dielectric 131 and gate conductor 132 can be formed over the entire substrate and then, using an inverse image of the mask pattern from FIG. 6A, patterning and etching the gate conductor 132. For example, if a positive resist was used at the stage of FIG. 6A, a negative resist using the same reticle can be employed in FIG. 10, or vice versa. Thus, the gate electrode 132 is left in the recessed portions of the field isolation 102 and into recessed portions of the silicon mesas 106, in the same pattern as the openings 148 and 149 (FIG. 6A).

As only portions of the active area mesa 106 exposed through the line openings 148 are exposed to the isotropic etch process as a result of the mask layer 146 (FIG. 6A), only these portions are thereby thinned. Thus, the fin 124 is confined to the channel region under the gate conductor 132, perhaps slightly wider near the edges of the mesas 106 due to the undercut effect of the isotropic etch. The process illustrated in FIGS. 6-11 can be considered a damascene-like process because the gate 132 is deposited into a recessed line or trench in the field isolation 102.

Figure 10:
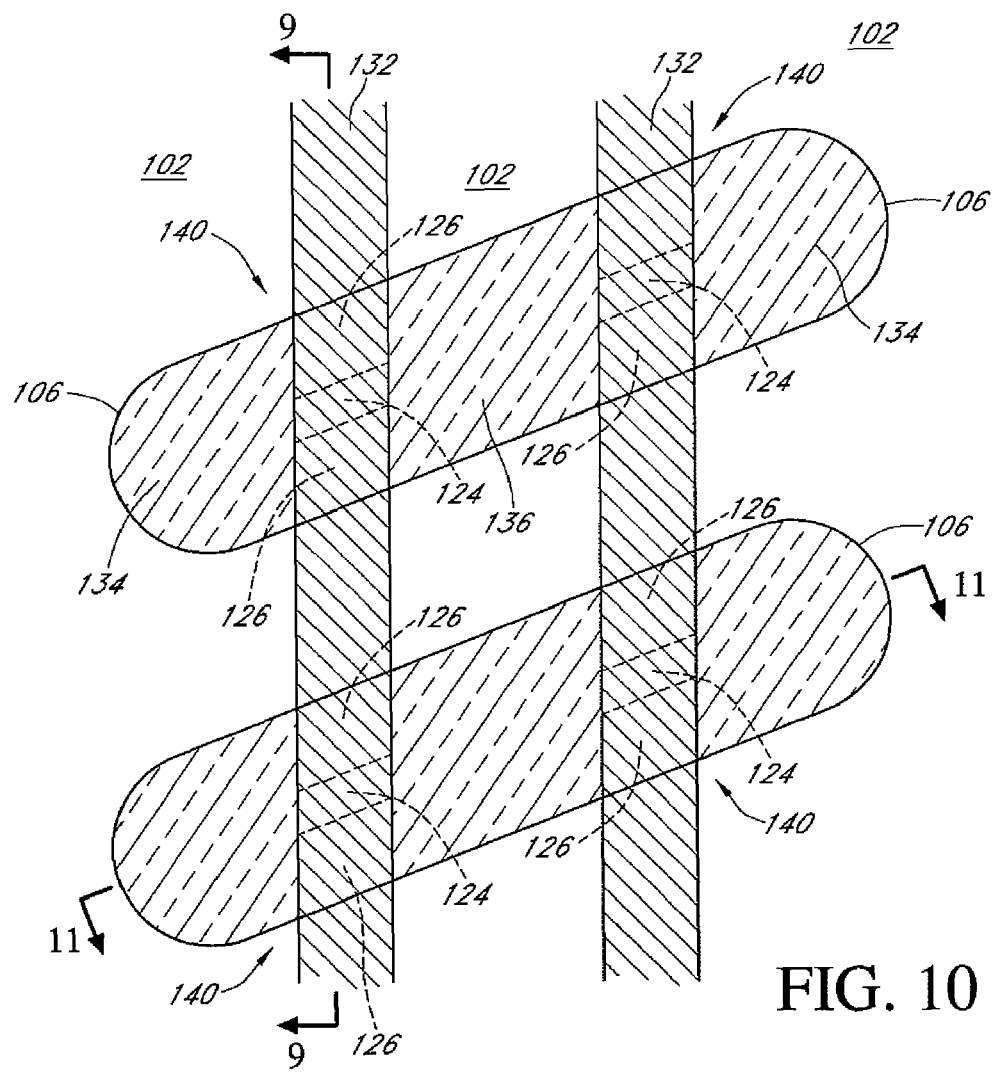
FIG. 10 is a simplified top view of an array of FinFET devices formed using the damascene-type process illustrated in FIGS. 6-9, showing the fins confined to channel or gate regions.

FIG. 10 illustrates the localized tapering of the active area mesas 106 in the channel regions that receive the conductor 132. Because the surfaces of the field isolation 102 and the majority of the mesas 106 (apart from the regions crossed by the gate conductors 132) are coplanar, removal of the gate electrode stack from over the source regions 136 and drain regions 134 is not difficult, as no step exists in those regions. As is also graphically illustrated in FIG. 10, two transistors 140 are formed for each active area mesa 106. A common source region 136 lies between the two gate conductors 132, but each of the transistors 140 has its own drain region 134.

Figure 11:
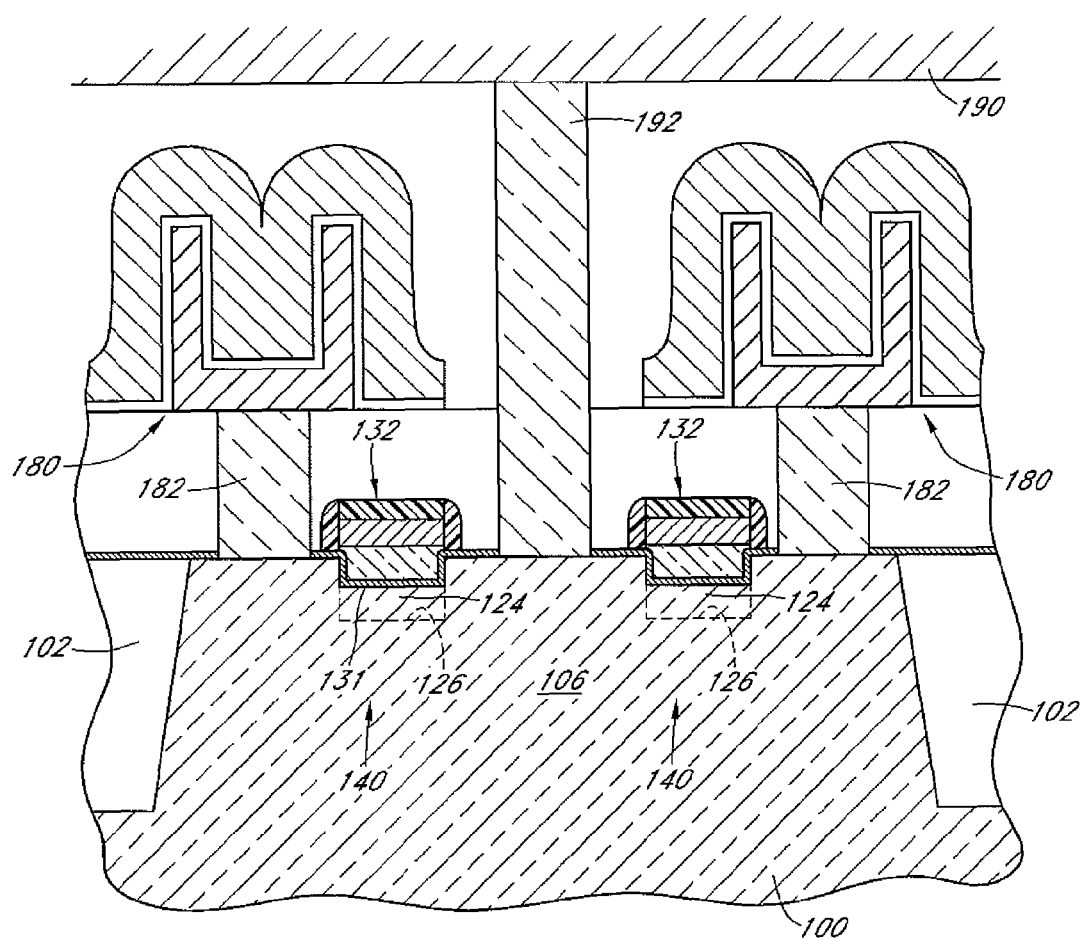
FIG. 11 is a cross-sectional view of two DRAM cells formed from a single active area mesa incorporating the FinFET devices formed by the process of FIGS. 6-9.

Referring now to FIG. 11, a cross-section is shown along the length of an active area mesa 106 after further processing to complete DRAM cells. As will be appreciated by the skilled artisan, the channel for each of the transistors extends from the common source area 136 along the surface of the active area mesa 106 toward the drain region 134 of each transistor. This channel region thus includes the undulations (see FIG. 9) caused by formation of the fin 124. The channel length is thereby lengthened relative to a planar device. The channel region of each transistor includes a fin 124, which is recessed relative to the source/drain regions 134, 136, and further recessed lower regions 126, indicated by dotted lines in FIG. 11 as they are not visible in the cross-section.

FIG. 11 represents two DRAM cells formed from a single active area mesa 106. Each cell includes a transistor 140 (including the common source 136, individual drain regions 134, individual gate electrodes 132 and the channels formed thereunder) as well as a storage device, in the illustrated embodiment represented by a three-dimensional folding capacitor 180. A capacitor contact 182 extends between the drain 134 and the capacitor 180 of each memory cell. The common source 136 is connected to a bit line 190 by way of a bit line contact 192.

The foregoing processes describe several implementations wherein a semiconductor protrusion that forms a channel region is tapered or otherwise precisely contoured by dry isotropic etching, to thereby result in improved performance characteristics of the FinFET device. The dry isotropic etching effectively reduces the active area mesa 106 width at its upper portion, from a photolithographically defined dimension to a fin 124 width preferably below the lithographic limit, by the lateral etching action, at least within channel regions 148 of the active areas 106. Dry isotropic etching lends precision and control to this feature definition. Additionally, rounded end surfaces 128 of the fins avoid sharp corners and attendant high field strengths.

Thus, a method is provided for forming a FinFET device. The method includes forming a mesa of semiconductor material on a semiconductor substrate, where the mesa surrounded on lateral sides by an isolation material. The isolation material is recessed to expose lateral sides of the mesa of semiconductor material. The exposed lateral sides of the mesa are dry etched reduce the width of the mesa and define a contoured portion of the mesa of semiconductor material. A gate conductor is formed to conformally cover the contoured portion of the mesa of semiconductor material.

A method is also provided for defining a lateral dimension for a semiconductor structure. The method includes forming a semiconductor protrusion extending from a silicon oxide surface. The semiconductor protrusion is isotropically dry etched to define a contoured portion of the semiconductor protrusion.

An integrated circuit is also provided. The integrated circuit includes an active area mesa surrounded by field isolation material, the mesa including a source region, a drain region and a channel region between the source and drain regions. A semiconductor fin protrudes from the channel region of the mesa, while the source and drain regions are substantially planar. A gate electrode conforms to the surfaces of the fin in the channel region.

Although the above disclosed embodiments of the present teaching have shown, described and pointed out the fundamental novel features of the invention as applied to the above-disclosed embodiments, it should be understood that various omissions, substitutions, and changes in the form of the detail of the device, systems and/or methods illustrated herein may be made by those skilled in the art without departing from the scope of the present teachings. Consequently, the scope of the present invention should not be limited to the foregoing description but should be defined by the appended claims.

We claim:

1. An integrated circuit, comprising:
   an active area mesa surrounded by field isolation material, the mesa including a source region, a drain region and a channel region between the source and drain regions;
   a semiconductor fin protruding from the channel region of the mesa and isolated from the source and drain regions, the source and drain regions being substantially planar; and
   a gate electrode conforming to the surfaces of the fin in the channel region.

2. The integrated circuit of claim 1, wherein the fin is recessed relative to the planar source and drain regions.

3. The integrated circuit of claim 2, wherein portions of the channel region adjacent the fin are recessed relative to both the planar source and drain regions and the fin.

4. The integrated circuit of claim 1, wherein gate electrode forms part of a word line at least partially recessed within the field isolation material.

5. The integrated circuit of claim 1, further comprising a second channel region spaced from the channel region by the source region, and a second gate electrode, the second channel region comprising a second fin protruding therefrom and the second gate electrode conforming to surfaces of the second fin.

6. The integrated circuit of claim 5,
   further comprising a second drain region spaced from the source region by the second channel region;
   wherein the source, the channel, the drain and the gate electrode define a first transistor of the semiconductor mesa; and
   wherein the source, the second channel, the second drain and the second gate electrode define a second transistor of the semiconductor mesa.

7. The integrated circuit of claim 6, further comprising a first storage capacitor electrically connected to the drain region, a second storage capacitor electrically connected to the second drain region, and a bit line electrically connected to the source region to define two memory cells over the active area mesa.

8. The integrated circuit of claim 1, wherein the fin has a width of less than about 300 Å.

9. The integrated circuit of claim 1, wherein the fin has a width of between about 200 Å and 250 Å.

10. A Fin FET device comprising:
    a mesa of semiconductor material on a semiconductor substrate, wherein the mesa comprises a contoured portion, wherein the mesa is surrounded on lateral sides by an isolation material, and wherein the isolation material is recessed relative to the contoured portion;
    a gate dielectric conformally covering the contoured portion of the mesa; and
    a gate conductor conformally covering the gate dielectric covering the contoured portion of the mesa,
    wherein the source and drain regions are substantially planar, and the contoured portion is recessed relative to the planar source and drain regions.

11. The device of claim 10, wherein the mesa of semiconductor material further includes a source region, a drain region and a channel region between the source and drain regions, and the contoured portion protrudes from the channel region of the mesa.

12. The device of claim 10, wherein portions of the channel region adjacent the contoured portion are recessed relative to the source region, the drain region and the contoured portion.

13. The device of claim 10, wherein the gate conductor forms part of a word line at least partially recessed within the isolation material.

14. The device of claim 11, further comprising:
    a second channel region spaced from the channel region by the source region, the second channel region comprising a second contoured portion protruding therefrom;
    a second drain region spaced from the source region by the second channel region;
    a second gate dielectric conformally covering the second contoured portion; and
    a second gate conductor conformally covering the second gate dielectric;

wherein the source, the channel, the drain and the gate conductor define a first transistor of the semiconductor mesa; and wherein the source, the second channel, the second drain and the second gate conductor define a second transistor of the semiconductor mesa.

15. The device of claim 14, further comprising a first storage capacitor electrically connected to the drain region, a second storage capacitor electrically connected to the second drain region, and a bit line electrically connected to the source region to define two memory cells.

16. A semiconductor structure comprising:
   a semiconductor mesa surrounded by field isolation regions, wherein the semiconductor mesa comprises a rounded portion; and
   a gate dielectric conformally covering the rounded portion of the semiconductor mesa, wherein the semiconductor mesa further includes a source region and a drain region, and the rounded portion is recessed relative to the source and drain regions.

17. The semiconductor structure of claim 16, further comprising a transistor gate conductor conformally covering the gate dielectric covering the rounded portion of the semiconductor mesa.

18. The semiconductor structure of claim 17, wherein the semiconductor mesa further includes a channel region between the source and drain regions, and the rounded portion protrudes from the channel region of the mesa.

19. The semiconductor structure of claim 16, wherein the rounded portion has a width of less than about 300 Å.

20. The semiconductor structure of claim 16, wherein the source region and the drain region are substantially planar.

* * * * *